United States Patent
Komine et al.

(10) Patent No.: US 6,678,294 B1
(45) Date of Patent: Jan. 13, 2004

(54) DISTRIBUTED FEEDBACK LASER APPARATUS FOR AVOIDING STIMULATED BRILLOUIN SCATTERING

(75) Inventors: Hiroshi Komine, Torrance, CA (US); Stephen J. Brosnan, San Pedro, CA (US); Michael G. Wickham, Rancho Palos Verdes, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 83 days.

(21) Appl. No.: 09/707,219

(22) Filed: Nov. 6, 2000

(51) Int. Cl.[7] .................................................. H01S 3/13
(52) U.S. Cl. ...................................... 372/38.01; 372/28
(58) Field of Search ............................... 372/38.01, 32, 372/24, 29; 359/183, 279

(56) References Cited

U.S. PATENT DOCUMENTS

| | | | | |
|---|---|---|---|---|
| 4,699,452 A | * | 10/1987 | Mollenauer et al. ........ 359/160 |
| 4,835,782 A | * | 5/1989 | Kaede et al. ................. 372/32 |
| 4,959,826 A | * | 9/1990 | Smith ........................... 398/90 |
| 5,329,396 A | * | 7/1994 | Fishman et al. ............. 359/160 |
| 5,473,625 A | | 12/1995 | Hansen et al. |
| 5,477,368 A | * | 12/1995 | Eskildsen et al. ........... 398/147 |
| 5,721,456 A | * | 2/1998 | Kebukawa ..................... 257/83 |
| 5,892,607 A | * | 4/1999 | Atlas ........................... 398/201 |
| 6,185,232 B1 | * | 2/2001 | Hess et al. ................... 372/102 |
| 6,200,309 B1 | * | 3/2001 | Rice et al. ..................... 606/10 |
| 6,331,908 B1 | * | 12/2001 | Adams et al. ............... 398/200 |
| 6,396,856 B1 | * | 5/2002 | Sucha et al. ................. 372/25 |

* cited by examiner

*Primary Examiner*—Paul Ip
*Assistant Examiner*—Dung Nguyen

(57) ABSTRACT

A seed laser apparatus is disclosed. It comprises a distributed feedback laser system for transmitting a dithered optical signal having a frequency versus time characteristic that is represented by a triangular waveform and an optical medium including a plurality of optical signal paths, each path including an optical fiber and a fiber amplifier. The optical medium is characterized by stimulated Brillouin scattering (SBS) having a response time, whereby the period of the triangular waveform is equal to the round-trip transit time in the fiber or shorter than the response time of the SBS.

2 Claims, 1 Drawing Sheet

US 6,678,294 B1

DISTRIBUTED FEEDBACK LASER APPARATUS FOR AVOIDING STIMULATED BRILLOUIN SCATTERING

BACKGROUND OF THE INVENTION

1. Field of the Invention

The present invention relates to a distributed feedback laser apparatus, and more particularly to a distributed feedback laser apparatus that produces a dithered optical signal having a frequency versus time characteristic that is represented by a triangular waveform.

2. Discussion of the Prior Art

In high power coherent arrays of fiber amplifiers, a single laser source seeds all the fiber amplifiers. The source must provide a coherent common temporal coherence to all the fiber amplifiers in the array. However, coherent high power fiber arrays are limited in power by nonlinear processes that erode the mutual output phase coherence relative to that of the common seed source. The primary optical phase distortion mechanisms in these fiber amplifiers include four-wave mixing and cross phase modulation. These mechanisms can be suppressed by employing a single frequency laser source. However, another nonlinear optical interaction due to stimulated Brillouin scattering (SBS) prevents fiber amplifiers from reaching high power output.

SBS is an inherent effect that occurs in fiber amplifiers in which a substantial fraction of the forward-propagating power in the amplifier is converted into backward propagating power with a slight downward frequency shift. This limits the power transfer through a fiber amplifier. SBS gain is dependent on beam intensity, spectral width, and fiber length. It should be recognized that SBS does not generally occur at low powers and for short lengths of optical fiber over which a signal is transmitted.

SBS has occasionally been a problem for telecommunications applications, but has been mitigated by broadening the spectrum of the signal. This is accomplished by passing a narrow line signal from a distributed feedback source through a modulator to effectively broaden the linewidth of the source. This raises the SBS threshold and thus avoids the creation of SBS. This type of source, however, is only available in very low power communications where the optical power is less than about 1 watt and the optical fiber is about 1 kilometer or greater. In these low power applications, repeaters are necessary along the optical fiber to amplify the optical signals passing therethrough.

An example of a semiconductor laser for use in suppressing SBS in a passive fiber in optical communications is found in U.S. Pat. No. 5,473,625 entitled "Tunable Distributed Bragg Reflector Laser for Wavelength Dithering" by Hansen et al. As will be described it employs a sinusoidal dither that has too much dwell time in the peak and valleys of the sinusoid, thus allowing SBS to occur.

What is needed, therefore, is a seed laser system that eliminates phase fidelity degradation due to four-wave mixing and produces an optical signal whose frequency is varied so rapidly that the medium cannot respond in a manner to reach SBS threshold in a fiber amplifier of given length and power.

SUMMARY OF THE INVENTION

The preceding and other shortcomings of the prior art are addressed and overcome by the present invention which provides a seed laser system. The system includes a current source for supplying a current signal and a distributed feedback laser that responds to the current signal and transmits a dithered optical signal having a frequency versus time characteristic that is represented in its most general form by an asymmetric triangular form. An optical medium includes a plurality of optical paths each having an optical fiber, a phase modulator and a fiber amplifier, and is characterized by a response time associated with stimulated Brillouin scattering (SBS). The height of the triangular waveform is related to the SBS response time and amplifier parameters. The period of the waveform is shorter than the response time of the SBS or equal to the round trip optical transmit time in the fiber. Preferably the waveform is of the sawtooth type.

The foregoing and additional features and advantages of this invention will become apparent from the detailed description and accompanying drawing figures below. In the figures and the written description, numerals indicate the various elements of the invention, like numerals referring to like elements throughout both the drawing figures and the written description.

DETAILED DESCRIPTION OF THE PREFERRED EMBODIMENTS

Figure 1:
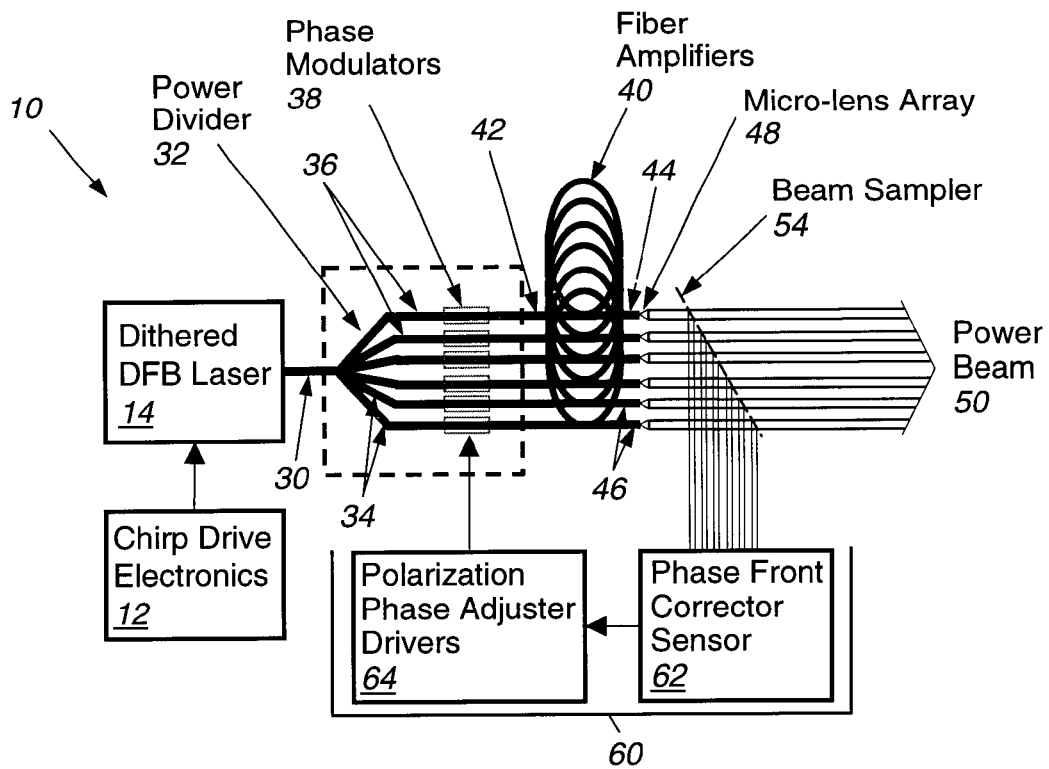
FIG. 1 is a schematic diagram of the seed laser system in accordance with the present invention.

As illustrated in the schematic diagram of FIG. 1, the present invention describes a seed laser apparatus, generally designated by the numeral 10. The apparatus 10 includes an electronic driver 12 for providing a chirp electrical current signal to modulate and drive a distributed feedback (DFB) laser 14. The DFB laser 14 is well known in the industry, comprises a semiconductor laser and includes a Bragg grating. It transmits an optical signal having a single output frequency that has a direct correspondence to its input drive current. The Bragg grating is characterized by an optical spacing which is, in turn, a function of the refractive index of the semiconductor gain media. As is well known, injection of the drive current from the driver 12 changes the carrier density of the laser 14 and thus the effective index of refraction of the semiconductor gain media.

Figure 2:
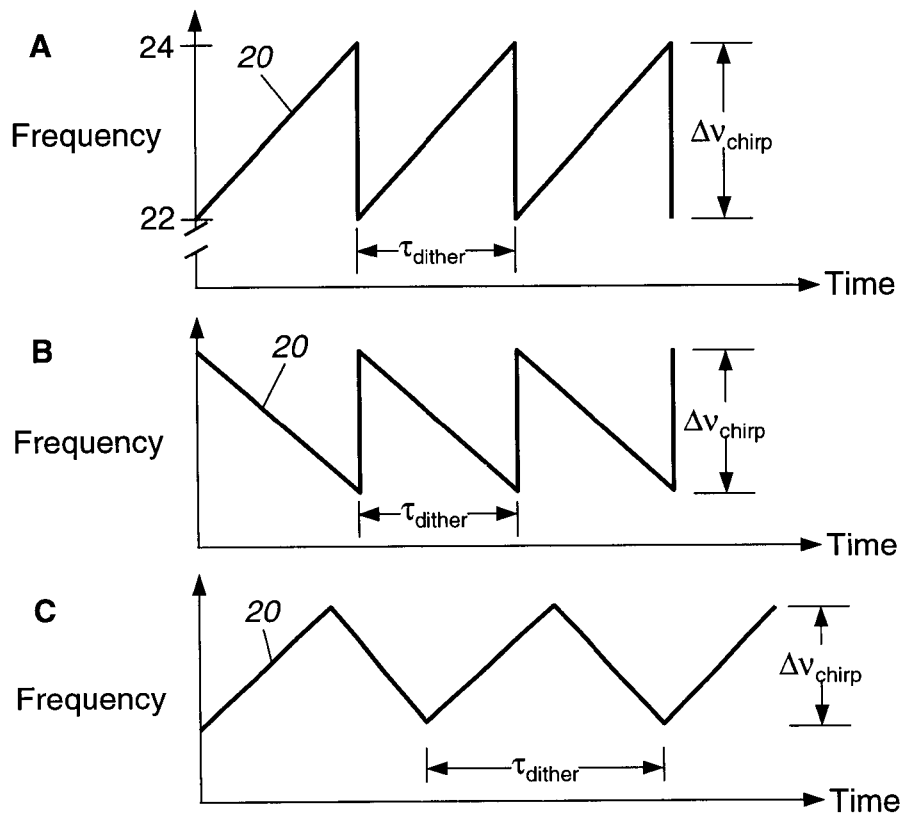
FIG. 2 shows three waveforms of the dithered optical signal transmitted by the distributed feedback laser in accordance with the present invention.

The output optical signal transmitted by the DFB laser 14 is illustrated in FIG. 2A. It has a triangular waveform and is designated by the numeral 20. As shown the optical signal 20 is particularly a sawtooth triangular waveform with its frequency ramping linearly, increasing from a minimum frequency 22 to a maximum frequency 24. At the maximum frequency 24 the frequency drops back to the minimum frequency 22 substantially instantaneously. The time for the cycle to occur is described as the dither time and identified as $\tau_{dither}$. The optical signal repeats this ramp up and step down periodically during amplifier operation. The difference between the maximum frequency and the minimum frequency is referred to as chirp range of frequencies and shown as $\Delta v_{chirp}$. At any instant of time the optical signal 20 is a single frequency. Also, because of the sawtooth shape, the frequency never dwells or remains relatively constant over any short period of time. As was previously stated, the drive current supplied by the driver 12 corresponds directly to the shape of the optical signal 20, and thus also has a sawtooth triangular waveform.

FIG. 2B shows another optical signal that can be used, which is the mirror image of the sawtooth signal of FIG. 2A. Another, more general, optical signal that can be employed is shown in FIG. 2C, which is an asymmetric triangular waveform where the upward and downward slopes are unequal. For optimum performance the duration of one of these slopes must be less than the SBS response time. The duration of the other slope must be greater than the optical round-trip time in the fiber amplifier.

The shape of the optical signal is an important feature of this invention. It can not be a sinusoid because of the relatively constant frequency range at the dwell times, corresponding to 90° and 270°, of the sinusoidal pattern. It is expected that these flat range of dither frequencies will create or allow to occur the SBS associated with the fiber amplifiers included in the system, rather than eliminate or preclude the SBS from forming.

Another example of a transmitted frequency pattern that has been found to be ineffective in suppressing non-linear effects, although it does serve to reduce SBS, is one containing a broadband comb of frequencies. More particularly, this broadband comb introduces other non-linear effects, such as four wave mixing, cross phase modulation and parametric amplification, and other third order non-linear effects as it broadens the spectrum as the signal is amplified in the fiber amplifier. This broadening destroys the temporal coherence of the amplified signal rendering it useless for coherent combining of multiple elements in a high power fiber array system.

An optical fiber 30 transmits the optical signal 20 to a power divider 32 that comprises a plurality of optical fibers 34, thus defining a plurality of optical paths, generally indicated by the numeral 36. Because of the high power being transmitted a single optical fiber can not carry the power. In each optical path 36 is a phase modulator 38 and a fiber amplifier 40. The phase modulator 38 receives the split and divided optical signal and a feedback signal that adjusts polarization and phase. The fiber amplifier 40 has an input 42 and an output 44. The fiber amplifiers 40 amplify the divided seed optical signals without changing their frequency or phase. A plurality of microlenses 46 form an array 48 and serve to collimate the amplified optical signals into a power beam 50. A beam sampler 54 samples a portion of the collimated optical signals in the power beam and routes them through a feedback network 60.

The feedback network 60 comprises a plurality of phase front corrector sensors 62 and polarization and phase adjuster drivers 64. The adjuster drivers 64 may be phase modulators, optical fiber stretchers or electro optic modulators and provide a time delay to the optical wave passing through the fiber so that all peaks and troughs of the optical signals 20 line up. Hence, the network 60 takes the plurality of sampled beams and develops a feedback signal for application to the phase modulators 38 to maintain the coherence of the phases of the plurality of optical signals 20.

Examples of a feedback network can be found in U.S. patent application Ser. No. 09/283,604 filed Apr. 1, 1999, now U.S. Pat. No. 6,229,616, "Heterodyne Wavefront Sensor," Stephen Brosnan et al., and U.S. patent application Ser. No. 09/066063, filed Apr. 24, 1998, now U.S. Pat. No. 6,219,360, "High Average Power Solid-State Laser System with Phase Front Control," Hiroshi Komine, both of which are assigned to the assignee of this application.

In accordance with the present invention, the equation for the dither range of the transmitted optical signals by the DFB laser sufficient to suppress SBS is $$\Delta v_{chirp} = \frac{\Delta v_{SBS} g_B L(\pi/4) P}{AG},$$

where $\Delta v_{chirp}$ is the chirp frequency range of the dithered signal,

P is the amplifier power output, $\Delta v_{SBS}$ is the line width of the SBS response, $g_B$ is the gain coefficient of the SBS associated with the optical fiber, L is the length of the optical fiber, A is the effective area of the fiber optical mode, and G is the overall amplifier gain.

It should be recognized that the terms P, A, G and L relate to the physical characteristics and that $g_B$ and $\Delta v_{SBS}$ relate to the properties of the optical material.

The power P is 40% of the target amplifier power. Also, the factor $\pi/4$ is for the case of a linear sawtooth ramp as shown in FIG. 2A. It has been found that the SBS has a finite response time, i.e. the transient time. Thus, the dither retrace should be faster than the SBS response time of the fiber optical amplifier medium. Four wave mixing can not be generated because there is never more than one optical frequency at a given time.

The revisit time for any frequency is the longer of two time scales. The two time scales are the round-trip photon transit time in the fiber amplifier and the reciprocal of the SBS bandwidth. This SBS threshold varies for a given fiber length and mode area and thus the dither format is a function of these parameters as shown by the equation.

In certain high power applications the DFB laser transmits a dither signal at the peak of the fiber amplifier gain spectrum (around 1.09 microns for Yb—glass fiber). The amplified beam generates output power between 10's to 100's of watts using fiber lengths between 10 and 50 meters.

In operation, the DFB laser 14 generates a dithered optical signal 20 having an asymmetric triangular (sawtooth in preferred embodiment) waveform. The waveform corresponds to the current drive produced by the chirp drive electronics 12. The dithered optical signal 20 is divided by the power divider and conducted through a plurality of optical fibers 30, each forming an optical path 36. The optical signals are amplified by the fiber amplifiers 40 and collimated by the microlens array 48 into a power beam 50. Because of the sawtooth waveform of frequencies supplied to the amplifiers 40, which have a periodicity that is longer than the round-trip transit time or is shorter than the response time of the SBS associated with the fiber amplifiers, SBS is not created. Thus phase fidelity is preserved and a maximum power transfer is achieved through the amplifiers. The beam 50 is sampled and sent through an optical feedback network 60, containing phase front corrector sensors 62, and polarization and phase adjuster drivers 64 to phase modulators 38 at the input of the fiber amplifiers 40. The feedback network 60 serves to maintain the coherence of the optical signals.

Although the present invention has been particularly shown and described with reference to the preferred embodiments, it will be understood by those skilled in the art that various modifications in form and detail may be made therein without departing from the scope and spirit of the invention. Accordingly, modifications such as those suggested above, but not limited thereto, are to be considered within the scope of the invention.

What is claimed is:

1. A laser system that produces an array of coherent output beams and minimizes or avoids Stimulated Brillouin Scattering (SBS) and four-wave mixing, the laser system comprising:

a current source for supplying a current signal;

a seed laser responsive to the current signal to produce an optical output at a selected frequency determined in part by the current signal;

a plurality of optical fiber amplifiers coupled in parallel to the optical output of the seed laser and having output ends arrayed to provide a coherent combination of output beams; and a feedback circuit for ensuring that the output beams are matched in phase and polarization, the feedback comprising a beam sampler disposed in the output beams, a phase front corrector sensor to which samples the output beams are coupled, and means for adjusting the phase and polarization of each optical signal input to the optical amplifiers, wherein the output beams, although dithered in frequency, are phase coherent at all times and are combinable into a composite coherent power beam;

wherein the current signal supplied by the current source has a sawtooth waveform, resulting in a laser output signal of which the frequency is dithered periodically between a minimum frequency and a maximum frequency;

and wherein the sawtooth waveform has a period that is no greater a round trip optical transit time associated with each of the fiber amplifiers, which condition effectively suppresses SBS;

and wherein four-wave mixing cannot occur because there is, at any selected time, no more than one frequency component transmitted into each fiber.

2. A laser system as defined in claim 1, wherein the seed laser is a distributed feedback laser.

* * * * *